(12) United States Patent
Tang et al.

(10) Patent No.: US 8,766,195 B2
(45) Date of Patent: Jul. 1, 2014

(54) DISTANCE DETECTION INDUCTION DEVICE

(75) Inventors: Qiaomei Tang, Shanghai (CN); Guofeng Chen, Shanghai (CN); Xingyan Liu, Shanghai (CN)

(73) Assignee: Shanghai Kohler Electronics Ltd., Shanghai (CN)

( * ) Notice: Subject to any disclaimer, the term of this patent is extended or adjusted under 35 U.S.C. 154(b) by 649 days.

(21) Appl. No.: 13/061,107

(22) PCT Filed: Aug. 27, 2009
(Under 37 CFR 1.47)

(86) PCT No.: PCT/CN2009/073571
§ 371 (c)(1),
(2), (4) Date: Aug. 10, 2012

(87) PCT Pub. No.: WO2010/022664
PCT Pub. Date: Mar. 4, 2010

(65) Prior Publication Data
US 2012/0298872 A1 Nov. 29, 2012

(30) Foreign Application Priority Data

Aug. 28, 2008 (CN) .......................... 2008 1 0042137

(51) Int. Cl.
*G01J 5/08* (2006.01)
*G01C 3/08* (2006.01)

(52) U.S. Cl.
USPC ........ 250/353; 356/3.01; 356/3.08; 356/4.01; 356/4.07

(58) Field of Classification Search
USPC ............... 250/353; 356/3.01, 3.08, 4.01, 4.07
See application file for complete search history.

(56) References Cited

U.S. PATENT DOCUMENTS

| | | | | |
|---|---|---|---|---|
| 5,233,382 A | * | 8/1993 | Taniguchi et al. | 396/113 |
| 7,046,344 B2 | * | 5/2006 | Yamamoto et al. | 356/4.01 |

FOREIGN PATENT DOCUMENTS

| | | |
|---|---|---|
| CN | 1573286 A | 2/2005 |
| CN | 101387515 A | 3/2009 |
| CN | 101387512 B | 6/2010 |
| CN | 101387513 B | 6/2010 |
| CN | 101387514 B | 7/2010 |
| JP | 9-229679 A | 9/1997 |
| JP | 10-300460 A | 11/1998 |

OTHER PUBLICATIONS

International Search Report and Written Opinion with English translation for International Application No. PCT/CN2009/073571, mail date Dec. 3, 2009, 23 pages.

* cited by examiner

*Primary Examiner* — David Porta
*Assistant Examiner* — Kenneth J Malkowski
(74) *Attorney, Agent, or Firm* — Foley & Lardner LLP (57) ABSTRACT

A distance-detecting sensor may include a housing, a focusing lens, and a circuit board. Infrared light may be transmitted by a transmitter and received by a receiver. The housing may include a main body having two apertures. A transmitting lens and a receiving lens may each be positioned within one of the apertures. The circuit board may be positioned above the transmitter and the receiver and below the transmitting lens and the receiving lens. The transmitter may be an infrared light emitting diode and the receiver may be a distance-detecting sensing module. A shielding case may be provided around the transmitter and the receiver to prevent electromagnetic interference.

13 Claims, 7 Drawing Sheets

DISTANCE DETECTION INDUCTION DEVICE

CROSS-REFERENCE TO RELATED PATENT APPLICATIONS

This application is a U.S. National Phase Application claiming the benefit of and priority to International Application No. PCT/CN2009/073571, filed Aug. 27, 2009, which claims the benefit of and priority to Chinese Patent Application No. 200810042137.8, filed Aug. 28, 2008. The entire disclosures of International Application No. PCT/CN2009/073571 and Chinese Patent Application No. 200810042137.8 are incorporated herein by reference.

TECHNICAL FIELD

The present invention relates to an infrared sensor, especially to a distance detecting sensor (i.e. PSD, a position sensitive detector) in the field of automatic sanitary & bathing devices, for an automatically-sensing faucet, an automatically-flushing urinal, and the like.

BACKGROUND ART

An infrared sensor has been widely used in a sanitary apparatus such as an automatic faucet, an automatic flushing urinal, a toilet closet flushing apparatus, a toilet seat with hot water ejection, a hand dryer, a toilet closet provided with a hot fan, and the like.

Most of traditional infrared sensors generally employ an active infrared sensing manner. That is, an infrared transmitter emits infrared rays with a certain wavelength, which are reflected by the body of a person and then received by an infrared receiver, for determining an intensity of the reflected signal to achieve an automatic sensing determination. However, for some materials (such as black clothes, hair, etc.) having a low reflectivity with respect to infrared rays, it is quite difficult to achieve an automatic sensing determination. After the infrared rays from the infrared transmitter are reflected by said materials, only little infrared rays can be received by the infrared receiver. Due to an insufficient intensity of the reflected signal, the sensor cannot determine whether or not there is an object, and thus fails in sensing.

Figure 9:
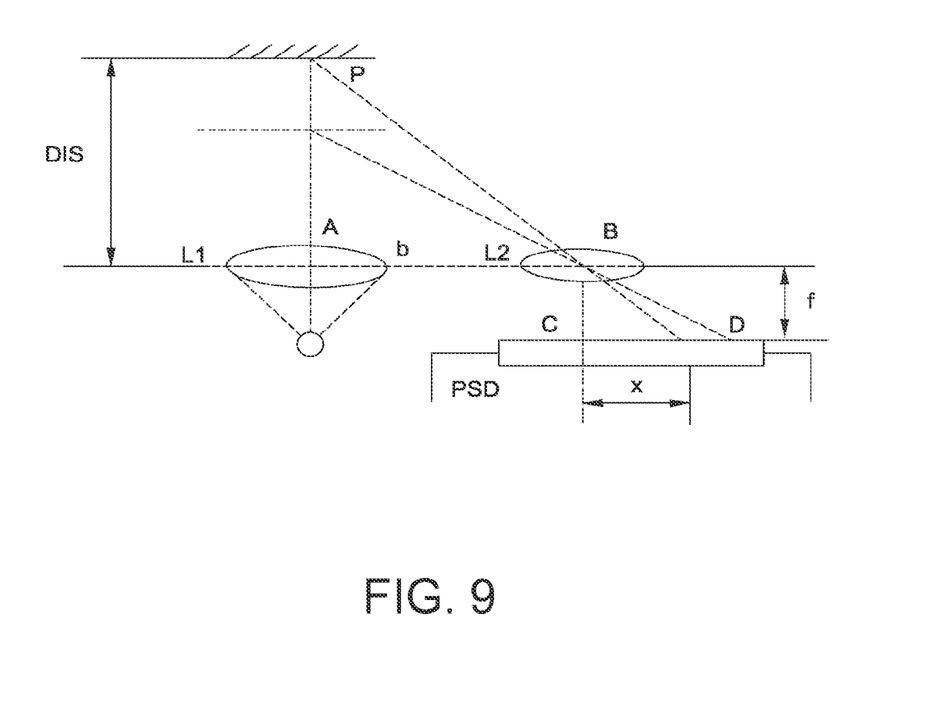
FIG. 9 is a view illustrating operating principles of the distance detecting sensor of the prior art.

In order to solve the above-mentioned problem of failure in sensing with respect to the traditional infrared bathroom product, a distance detecting sensor (PSD) is introduced into the field of automatic sanitary & bathing devices. As shown in FIG. 9, the PSD sensor is a photoelectric element sensitive to a position of an incident light. That is, when an incident light is irradiated to different positions of the light-sensing surface of a device, the PSD will output different electric signals. The PSD sensor utilizes the triangulation measuring principle, with a character of precise distance measurement, to achieve the automatic sensing determination. As shown in FIG. 9, the lights emitted from the light source, after being focused by the lens L1, are projected to the surface of the object to be detected. The reflected lights are focused by the lens L2 onto a one-dimension PSD to form a light point. Assuming that the distance between the centers of the lens L1 and L2 is b, the distance from the lens L2 to the PSD surface (i.e. the focal distance of the lens L2) is f, and the distance from the light point focused on the PSD surface to the center of the lens L2 is x, according to the characteristics of the similar triangles PAB and BCD, it can be concluded that the distance to be measured DIS is: DIS=bf/x. Therefore, if only the value of the position coordinate x of the light point on the PSD is measured, the distance of the object to be detected can be measured.

When it is detected that the distance of the object to be detected is within a predetermined range, the distance detecting sensor controls the operation status of the sanitary product, such as water-discharging, water-flushing, etc. As the distance detecting sensor achieves a purpose for automatic sensing by determining the distance between the object and the distance detecting sensor, rather than determining the intensity of the emitted signal, the defect of "failure in sensing due to an insufficient intensity of the reflected signal" in the traditional infrared-sensing means can be effectively solved.

However, for the sensor used in the sanitary & bathing industry, such as a sensitive faucet and a sensitive urinal, it is required that the sensor should have a relatively smaller volume to facilitate applying the sensor to the faucets or other sanitary & bathing products with various shapes. This is a special requirement for the sensitive sanitary & bathing products. For the above-mentioned distance detecting sensor, in this type of sensor where a focusing lens is used, it is necessary to take the problem of focal distance into account. If the detecting distance is longer, it is inevitably required that the lens should have a relatively larger diameter and thus a longer focus distance. In the common way, the infrared transmitting tube and the infrared receiving tube are welded directly on the traditional circuit board to face the lens, resulting in that the sensor box has a relatively large overall height and a relatively large volume as a whole. In this case, it is required to make a relatively large housing for the sensor accordingly, thus substantially limiting the appearance of the faucet or the sensitive urinal. Therefore, a problem to be solved is how to effectively control the size of a sensor having lens, such as a distance detecting sensor.

SUMMARY

The present invention seeks to provide a distance detecting sensor with a small size.

The objective of the present invention is achieved by the first technical solution as follows: providing a distance detecting sensor, comprising: a housing, a focusing lens, a circuit board, a transmitter device for transmitting infrared rays, a receiver device for sensing the reflected light rays, as well as a shielding case for a shielding function, wherein the housing comprises a main body and two circular apertures located on a top surface of the main body; the lens is installed in the main body of the housing and comprises a transmitting lens and a receiving lens disposed at positions of the apertures of the housing; the circuit board is installed in the main body of the housing and provided with several electronic elements, for signal processing; the transmitter device is installed on the circuit board, for transmitting the infrared light rays to the transmitting lens; the receiver device is a distance detecting sensing module, which is installed on the circuit board and receives and senses the reflected light rays focused by the receiving lens; the shielding case is installed around the transmitter device and the receiver device, for preventing electromagnetic interference. The transmitter device and the receiver device are installed on the same side of the circuit board; and the circuit board is provided, in positions where the transmitter device and the receiver device are installed, with first and second via holes respectively, such that the transmitted light rays from the transmitter device can travel through the first via hole to the transmitting lens and the reflected light rays received by the receiving lens can travel through the second via hole to the receiver device.

Further, the transmitter device is an infrared light emitting diode.

Further, the distance detecting sensor further comprises an indicator light for displaying an operation state or an abnormal condition, which is installed on the circuit board and located near the transmitter device.

Further, the shielding case is divided into first and second shielding cases welded with each other, wherein the first shielding case is fixed to the housing by a screw and contacts the circuit board to achieve grounding, the second shielding case is fixed to the housing by a clamping mechanism, and the transmitting device and the receiver device are installed between the shielding case and the circuit board.

Further, the distance detecting sensor further comprises a seal installed between the transmitting lens and the transmitter device or between the receiving lens and the receiver device.

Further, the distance detecting sensor further comprises a wiring arranging device fixed on the housing by a screw.

Further, the lens and the housing are formed together by injection molding.

Further, the housing is made of an electrically conductive material.

The objective of the present invention is achieved by the second technical solution as follows: providing a distance detecting sensor, comprising: a housing, a focusing lens, a circuit board provided with several electronic elements, as well as a transmitter device for transmitting infrared light rays and a receiver device for receiving and sensing the reflected infrared light rays, wherein the housing comprises an elongated main body and two apertures located on a top surface of the main body; the lens comprises a transmitting lens and a receiving lens located at positions of the two apertures of the housing; the circuit board is received in the main body of the housing and located below the lens, for signal processing; the transmitter device and the receiver device are installed on the circuit board and positioned directly below the transmitting lens and the receiving lens, wherein the transmitter device is an infrared light emitting diode and the receiver device is a distance detecting sensing module. The transmitter device and the receiver device are installed on the side of the circuit board opposite to the lens; and the circuit board is provided thereon, between the transmitting lens and the transmitter device and between the receiving lens and the receiver device, with a first via hole and a second via hole through which the transmitted light ray and the received light ray can pass respectively.

Further, a shielding body for preventing electromagnetic interference is disposed between the transmitter device and the transmitting lens.

Further, the distance detecting sensor further comprises a seal installed between the transmitting lens and the transmitter device or between the receiving lens and the receiver device.

Further, the lens and the housing are formed together by injection molding.

Further, the housing is made of an electrically conductive material.

Compared with the prior art, the distance detecting sensor of the present invention, by providing on the circuit board with via holes through which the transmitted light ray and the received light ray can travel, sufficiently utilizes the thickness of the circuit board to lower the size requirement of the sensor resulting from the focal distance, so as to effectively decrease the height of the sensor.

DETAILED DESCRIPTION OF THE EMBODIMENTS

Hereinafter, the various embodiments of the present invention will be explained in detail in reference with the figures, wherein the like structure or function is designated by the like reference numeral. It should be noted that, the figures are provided only for a purpose to facilitate illustrating the particular embodiments of the present invention, but do not mean a redundant illustration or a limitation to the scope of the present invention. In addition, it is not necessary to draw the figures in proportion.

As shown in FIGS. 1-7, the distance detecting sensor 100 of the present invention is generally installed in various types of sanitary & bathing automatic apparatuses, such as a sensitive urinal, a sensitive toilet closet, a sensitive faucet, etc.

The distance detecting sensor 100 of the present invention generally includes: a housing 1, a focusing lens 2, a circuit board 3 provided with several electronic elements, a transmitter device 4 for transmitting infrared light ray, a receiver device 5 for receiving and sensing the reflected light ray, and a shielding case 6 functioning as an electromagnetic shield.

In particular, the transmitter device 4 and the receiver device 5 are installed on the same side of the circuit board 3. In an embodiment illustrated in the present invention, the transmitter device 4 and the receiver device 5 are welded to the circuit board 3 by weld legs. The lens 2 is fixed to the housing 1, and includes a transmitting lens 21 for focusing and transmitting emitted infrared light rays and a receiving lens 22 for focusing the emitted light rays and irradiating them to the receiver device 5.

For the distance detecting sensor 100, it is required to have a certain precision with respect to a position between the transmitter device 4 and the receiver device 5 as well as positions of the transmitter device 4 and the receiver device 5 relative to the lens 2. Thus, the distance detecting sensor 100 of the present invention further includes a positioning bracket 7 for fixing the transmitter device 4 and a positioning bracket 8 for fixing the receiver device 5. The transmitter and receiver positioning brackets 7, 8 receive the transmitter device 4 and the receiver device 5, and are positioned by matching with the housing 1, thus ensuring the position precisions of the transmitter device 4 and the receiver device 5.

In addition, the shielding case 6 shields the periphery of the circuit board on a side where the transmitter device 4 and the receiver device 5 are installed, for preventing electromagnetic interference (EMI) from the ambient environment to the transmitter device 4 and the receiver device 5.

In particular, the housing 1 includes an elongated main body 10 as well as first and second circular apertures 11, 12 provided at a top surface of the main body 10. The lens 2, the circuit board 3 provided with several electronic elements, the transmitter device 4, the receiver device 5 and the shielding case 6 are all located in the main body 10 of the housing 1. Accordingly, the transmitting lens 21 and the receiving lens 22 of the lens 2 are installed in the first and second circular apertures 11, 12, respectively. The housing 1 is made of an insulating material (such as a general plastic). Indeed, in another preferable embodiment of the present invention, the housing 1 may be made of an electrically conductive material (such as a metal or an electrically conductive plastic, etc.), thus achieving a perfect effect for preventing electromagnetic interference.

In a preferable embodiment of the present invention, the transmitting lens 21 and the receiving lens 22 of the lens 2 are installed into the first and second circular apertures 11, 12 of the housing 1 by injection molding. Particularly, the lens 2 is installed to the housing 1 in a manner of a twice-injection molding process, that is, firstly the lens 2 is injection molded, and then the injection-molded lens 2 is placed into a mold for the housing 1 to be injection-molded integrally with the housing 1. In the manner of injection molding, the sealing between the lens 2 and the housing 1 is settled, and a precise relative position between the center of the lens 2 and the housing 1 can be ensured. In particular, the transmitting and receiving lens 21, 22 have lower portions which are formed as two cylindrical-shaped bodies, to facilitate ensuring a positioning precision during the process for injection molding with the housing 1. Particularly, the transmitting lens 21 and the receiving lens 22 are connected by a connector 23. In the previous design, the transmitting lens 21 and the receiving lens 22 are disposed separately. However, there should be a certain precision requirement between the transmitting lens 21 and the receiving lens 22 as well as between the lens 2 and each of the transmitter device 4 and the receiver device 5, and it is not easy to precisely control the position(s) in the design of a separate configuration, and thus it is obviously difficult to meet the precision requirement. Therefore, by connecting the transmitting lens 21 and the receiving lens 22 by means of the connector 23 so as to be installed as a whole, the positioning precision can be ensured. Furthermore, the connector 23 also has at least one zigzag, which can prevent the transmitted light rays from being conducted directly along the connector 23 to the receiving lens 22 so as to result in unnecessary inner light reflection and refraction phenomenon and thus influence the detection precision of the PSD. In the embodiment shown in FIG. 2 and FIG. 3, the connector is formed with several zigzag portions, thus substantially exhibits a Z shape. In view of the combination of the cost and the effects, with such a design, in order to travel from the transmitting lens 21 to the receiving lens 22, the light rays have to be reflected twice, wherein the light path becomes more complicated, thus effectively preventing the transmitted light rays from traveling directly from the transmitting lens 21 into the receiving lens 22. Indeed, the number of the zigzag portions may also become more or less, depending on the practical applications.

In another embodiment of the present invention, the lens 2 can also be installed to the housing 1 in a manner of fitting and assembling.

In particular, the circuit board 3 is integrated with several electronic elements, and is provided with a first via hole 31 and a second via hole 32 directly facing the transmitting lens 21 and the receiving lens 22, wherein the transmitter positioning bracket 7 is allowed to extend through the first via hole 31. The circuit board 3 processes the signal, and delivers the processed data to a main controller for further controlling the sanitary & bathing apparatus (not shown).

Figure 1A:
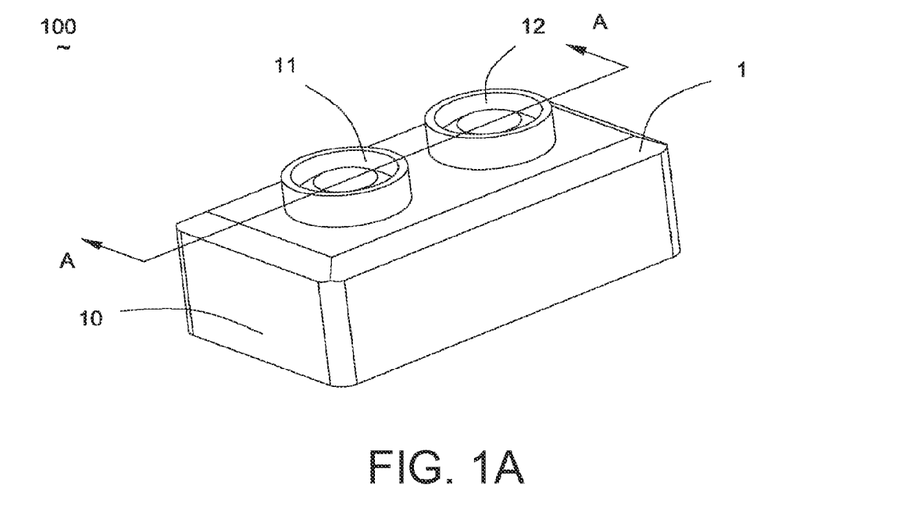
FIG. 1a is a perspective view of a distance detecting sensor of the present invention.
Figure 1B:
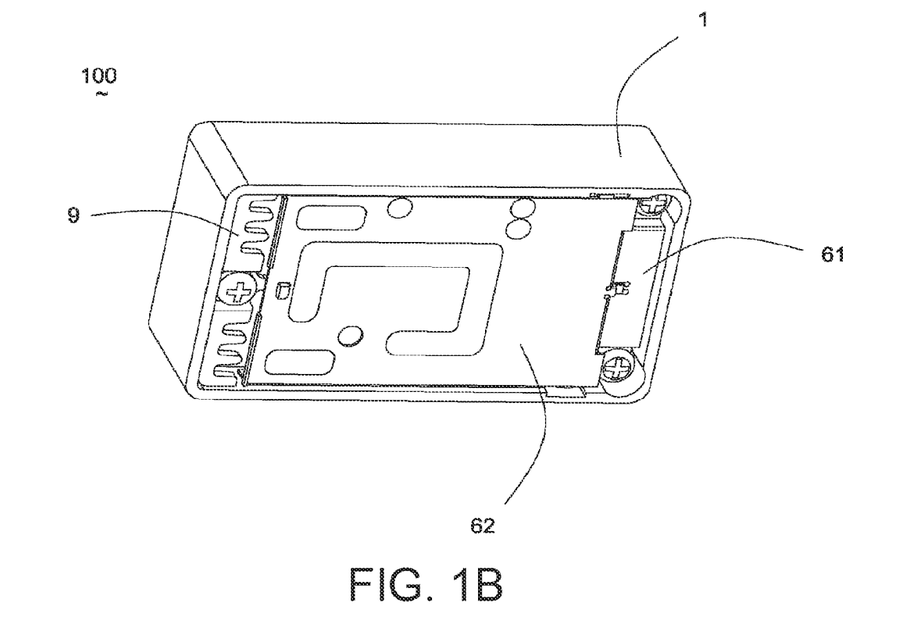
FIG. 1b is another perspective view of the distance detecting sensor of the present invention in another angle of view.
Figure 2:
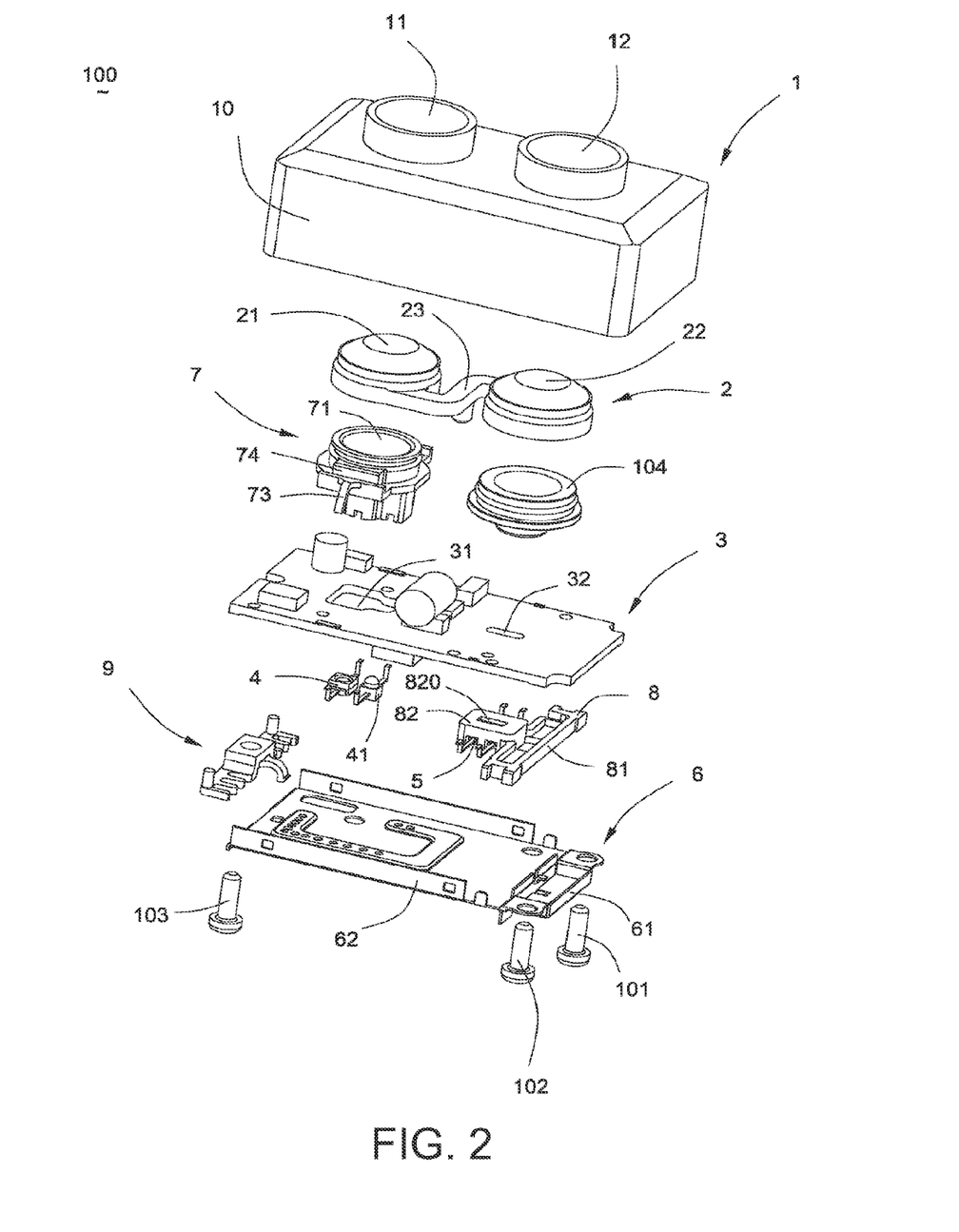
FIG. 2 is a schematic exploded view of the distance detecting sensor of the present invention.
Figure 3:
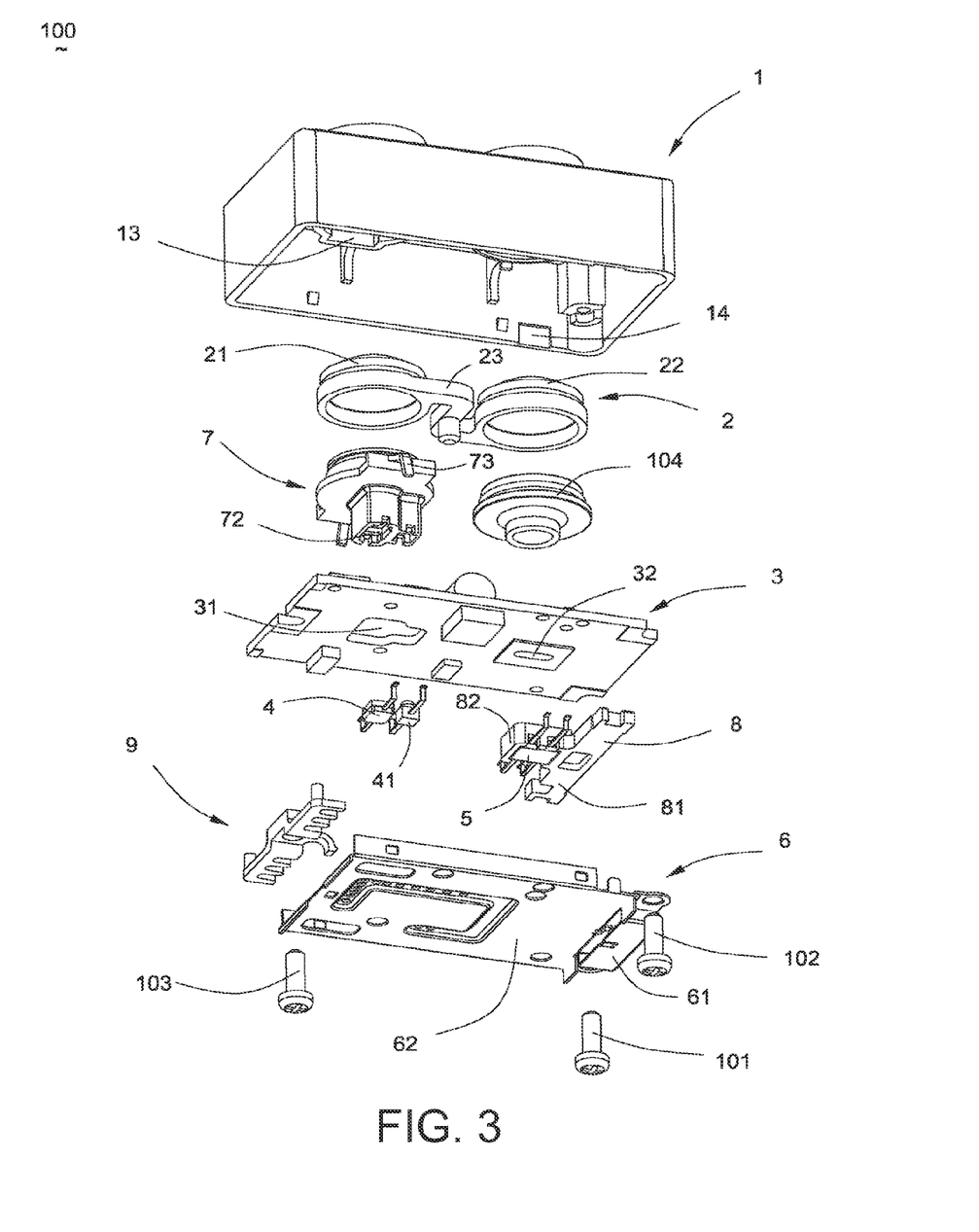
FIG. 3 is another schematic exploded view of the distance detecting sensor of the present invention in another angle of view.
Figure 4A:
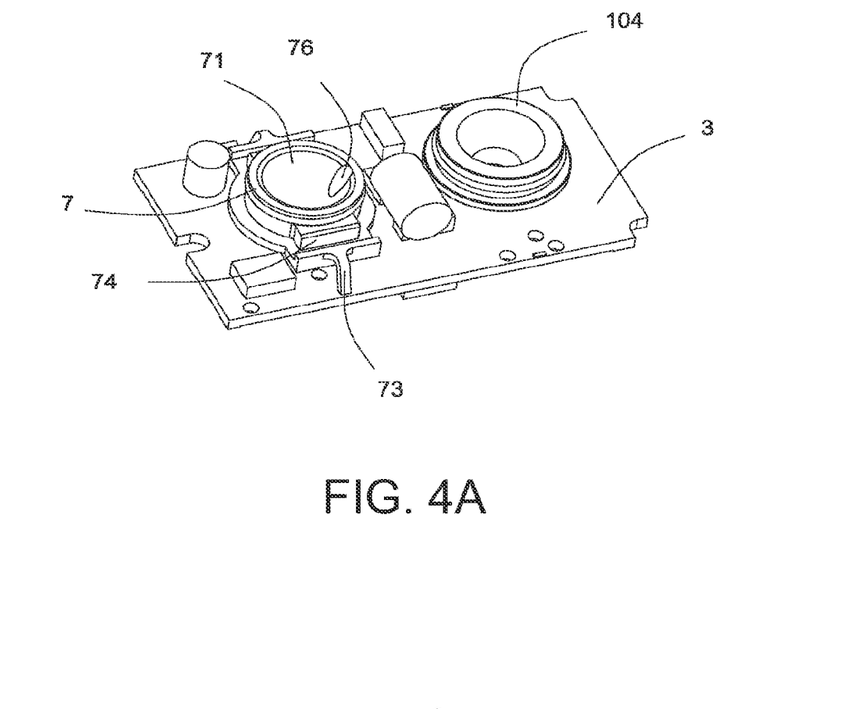
FIG. 4a is a partially-assembled perspective view of the distance detecting sensor of the present invention.
Figure 4B:
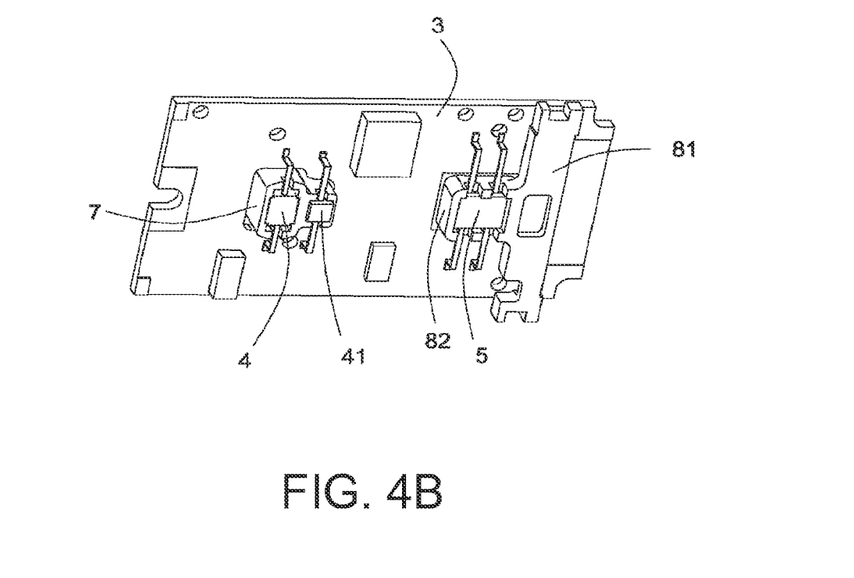
FIG. 4b is another view of the structure of FIG. 4a from another angle of view.
Figure 4C:
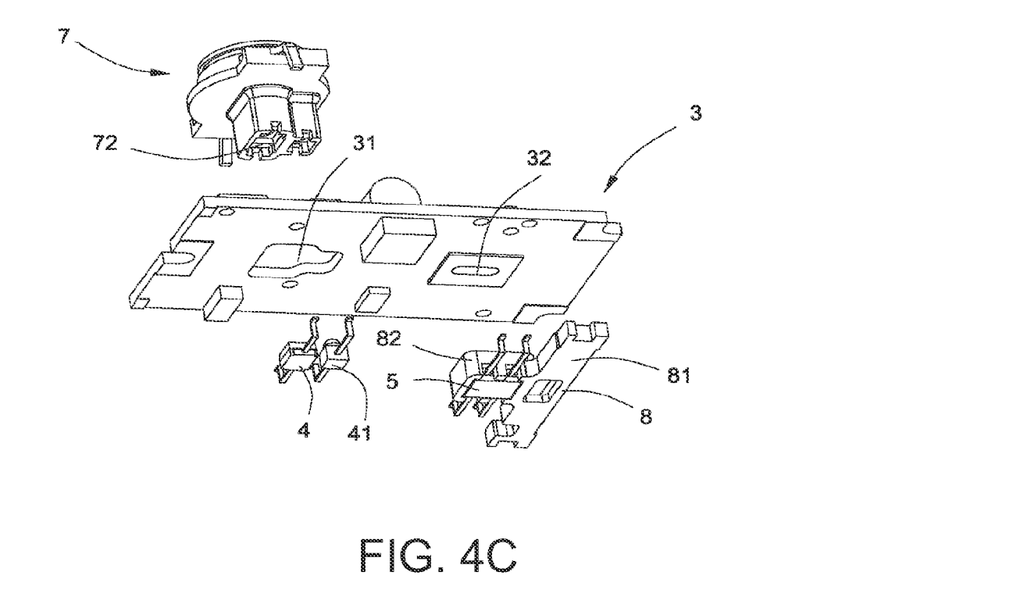
FIG. 4c is a schematic exploded view of the structure shown in FIG. 4b.
Figure 5:
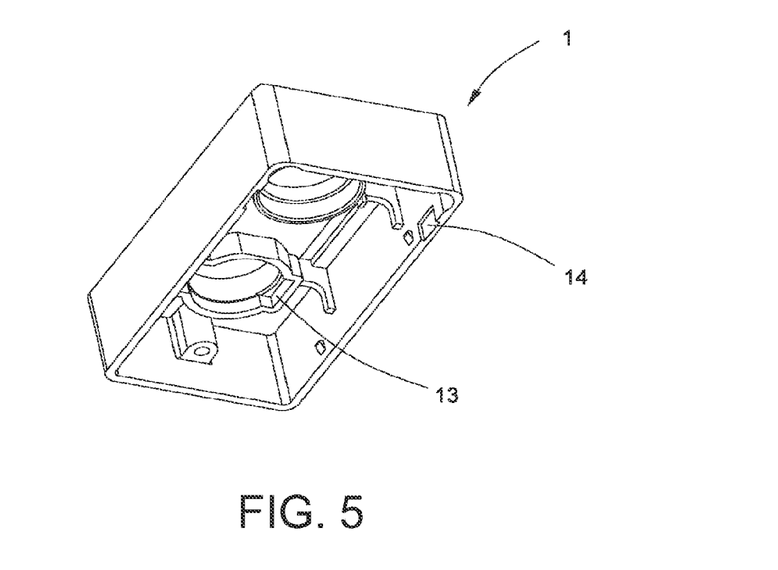
FIG. 5 is a view of a housing of the distance detecting sensor of the present invention.

In particular, the transmitter device 4 is an infrared light emitting diode (IR LED), installed on the circuit board 3 and located on the lower side surface of the circuit board 3 (as shown in FIGS. 2, 3, the surface of the circuit board 3 facing the lens 2 is the upper side surface, and the other surface of the circuit board 3 is the lower side surface). The transmitter device 4 is further provided at one side with an indicator light 41 for a function of indication, functioning as an indicating window representing an operation state or an abnormal condition (such as low battery) of the distance detecting sensor 100.

In particular, the receiver device 5 is a distance detecting sensing module (PSD Sensing Module), installed on the circuit board 3 and located also on the lower side surface of the circuit board 3.

In particular, the shielding case 6 is installed to a bottom portion of the housing 1 by screws 101, 102, for shielding the transmitter device 4 and the receiver device 5, and includes a first shielding case 61 and a second shielding case 62. The first shielding case 61 is firstly fixed to the housing 1, and by the screws 101, 102, contacts a grounding line of the circuit board 3 to achieve grounding, while the second shielding case 62 is fixed to the housing 1 in a clamping manner and is welded to the first shielding case 61 for contacting the same to achieve grounding. With such an arrangement, it is possible to avoid an individually configured one-piece shielding case which is inconvenient for installation and fixing.

In particular, the transmitter positioning bracket 7, which is installed to the housing 1, includes a large circular hole 71 located at a top end of the bracket and cooperating with the transmitting lens 21, and a container 72 located at a bottom end of the bracket for containing the transmitter device 4. The large circular hole 71 has a diameter substantially equivalent to that of the transmitting surface of the transmitting lens 21. The transmitter positioning bracket 7 is further provided, at both sides thereof, with extended supporting columns 73 for engaging the positioning bracket 7 with the circuit board 3, such that the circuit board 3 can provide the positioning bracket 7 with a sufficient supporting force to prevent the positioning bracket 7 from being disassembled from the housing 1 during installation or the occurrence of any other problems. Particularly, the transmitter positioning bracket 7 is further provided, at both sides thereof, with rectangular convex platforms 74, which cooperate with positioning grooves 13 on the inner top surface in the housing 1 to position the transmitter positioning bracket 7 and the housing 1. Indeed, the rectangular convex platforms 74 may be installed in other positions of the transmitter positioning bracket 7, and may have other shapes, such as a circular cylindrical shape. The container 72 of the transmitter positioning bracket 7 passes through the first via hole 31 of the circuit board 3 from above the circuit board 3, and receives the transmitter device 4 in position on the lower side surface of the circuit board 3. The weld legs of the transmitter device 4 protrude through the notches (not designated with reference numerals) on both sides of the container 72, and are flexed and then welded and connected with the circuit board 3. The transmitter positioning bracket 7 is made of an insulating material, and certainly may also be made of an electrically conductive material. When the transmitter positioning bracket 7 is made of an electrically conductive material, it can serve as a shielding body for preventing electromagnetic interference.

Figure 6:
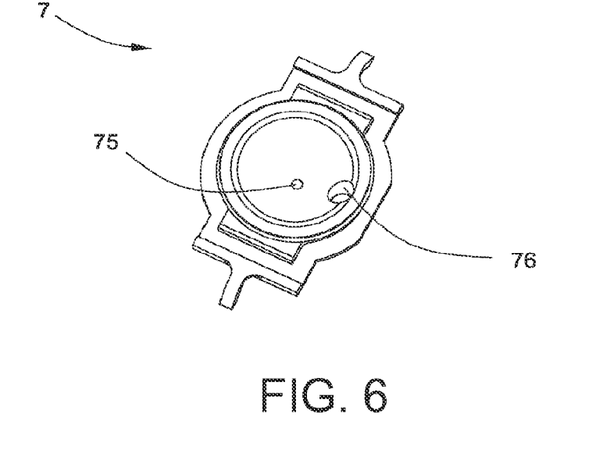
FIG. 6 is a view of a transmitter positioning bracket of the distance detecting sensor of the present invention.
Figure 8:
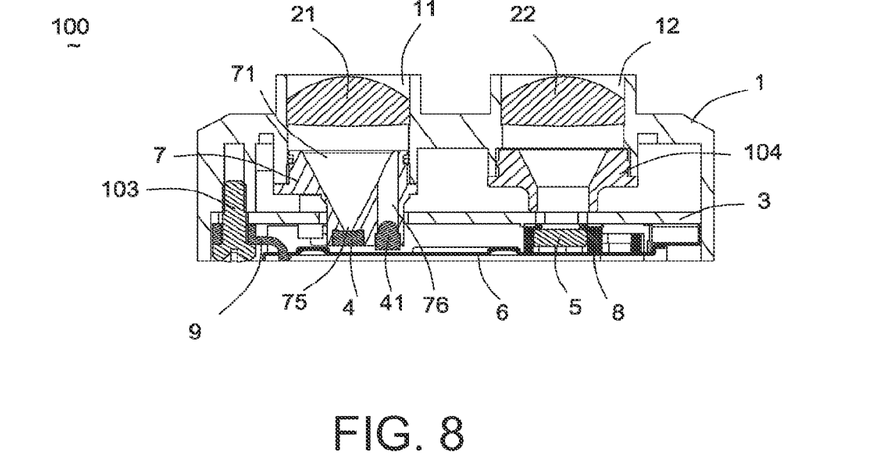
FIG. 8 is a section view of the structure of FIG. 1a along a line A-A therein.

As shown in FIG. 6, the transmitter positioning bracket 7 also includes a small circular hole 75 close to the container 72 of the transmitter device 4 as well as an indicator light displaying hole 76 for the indicator light 41. As shown in FIG. 8, the transmitter small circular hole 75 and the large circular hole 71 form a tapering infrared light transmitting channel. With such a configuration, the light rays can travel from a tube core of the transmitter device 4, through the small circular hole 75, via the large circular hole 71, then, be focused by the transmitting lens 21, and then be emitted. Thus, it can be assured that the transmitted light rays will not be irradiated to other regions in the housing 1 to influence efficiency and cause light interference, so as to further prevent influencing the detecting effect as the internal lights are reflected and refracted to the receiver device 5. Also, the transmitted light has a larger halo resulting from the relatively larger tube core of the transmitter device. This is a disadvantageous factor for a receiver device with a requirement of a precise signal, and would influence the detecting and sensing result. In the present embodiment, the infrared light ray emitted from the tube core of the transmitter device received in the container 72 is transmitted out only through the small circular hole 75. The small circular hole 75 has a radiating surface smaller than that of the transmitter device, and the needless portion is sheltered. Such a configuration is made so as to effectively decrease the influence from the halo with respect to the signal detection, thus improving the detection precision. Herein, the transmitter positioning bracket 7 functions as a guiding device for the emitted light rays.

Figure 7A:
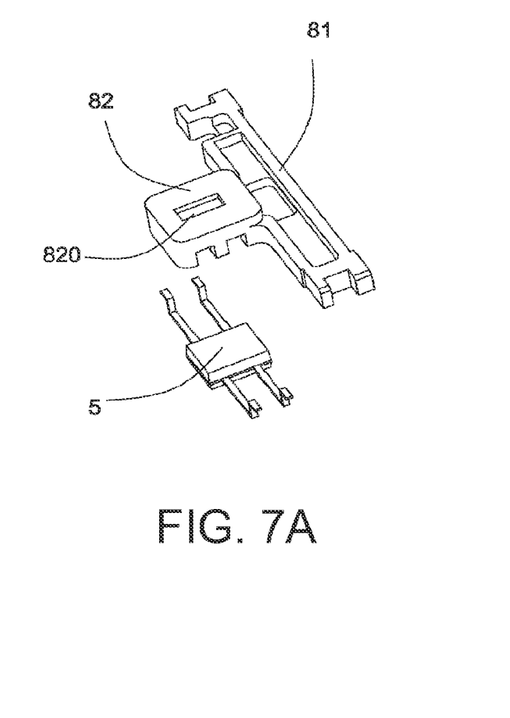
FIG. 7a is an exploded view of the receiver device as well as its positioning bracket of the distance detecting sensor of the present invention.
Figure 7B:
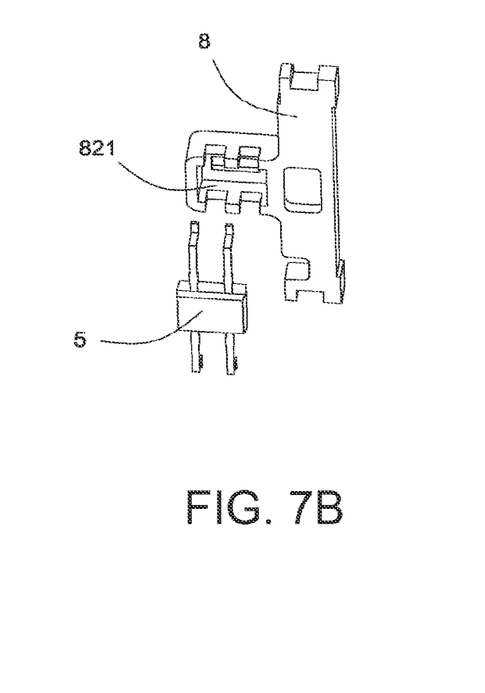
FIG. 7b is another view of the structure of FIG. 7a from another angle of view.

As shown in combination with FIG. 7*a* and FIG. 7*b*, the receiver positioning bracket 8 includes a beam 81 installed on the housing and a container 82 connected with the beam 81 for containing the receiver device 5. The container 82 has a containing space 821 for containing the receiver device 5. Moreover, the container 82 is provided, on the top surface thereof, with a rectangular opening 820 which is aligned with the second via hole 32 of the circuit board, to facilitate receiving the light rays into the receiving surface of the receiver device 5. The container 82 is formed which is extended horizontally from a central portion of the beam 81, such that the weld legs of the receiver device 5 can conveniently protrude from the notches (not designated with reference numerals) on both sides of the container 82 so as to facilitate welding. Also, two free ends of the beam 81 catch and cooperate with positioning grooves 14 on two side walls of the main body 10 of the housing 1, to achieve a purpose of effective positioning.

The distance detecting sensor 100 of the present invention further includes a wiring arranging device 9, which can effectively arrange the wires (not shown) on the circuit board 3 and be fixed in the housing 1 by a screw 103.

The distance detecting sensor 100 of the present invention further includes a seal 104 for a function of sealing located between the lens 2 and the circuit board 3. The seal 104, on one hand, can prevent ambient oxygen from entering the receiver device 5, for example entering the receiver device 5 through the second via hole 32, and on the other hand, can prevent interfering light rays from entering the housing 1 or entering the receiver device 5. In the present embodiment, the seal 104 is made of silicone, and certainly it can also be made of other sealing materials. Indeed, in case that the necessary conditions are satisfied, a similar seal structure can be also disposed between the transmitting lens 21 and the transmitter device 4.

As shown in combination with FIG. 8, since the circuit board 3 is provided with the first and second via holes 31, 32, the transmitted infrared light rays from the transmitter device 4 travel through the first via hole 31 to the transmitting lens 21. The transmitting lens 21 focuses the transmitted infrared light rays to the destination region. When a person or a moving object enters this destination region, the infrared light rays are reflected, and the receiving lens 22 receives the reflected infrared light rays, which are focused and then irradiated through the second via hole 32 onto the receiver device 5. The receiver device 5 calculates the distance of the object according to the triangulation measuring principle of the PSD, and eventually controls the sanitary & bathing apparatus. With such a configuration, the transmitter device 4 and the receiver device 5 can be installed onto the lower side surface of the circuit board 3 (that is, the surface of the circuit board 3 facing the lens 2 is the upper side surface, and the other surface of the circuit board 3 is the lower side surface). As the focal distance of the lens 2 required by the distance detecting sensor 100 of the present invention is constant, the thickness of circuit board 3 in such a configuration can be sufficiently utilized as a portion of the focal distance. Also, as it is necessary for the circuit board 3 to be provided thereon with other electronic elements, the transmitter device 4 and the receiver device 5 may be installed between these electronic elements, so as to sufficiently utilize the space in the housing 1 and on the upper and lower side surfaces of the circuit board 3. In conclusion, with such a configuration, the distance detecting sensor 100 can have a decreased overall height and a reduced volume as a whole.

In addition, after installation, the transmitter device 4 and the receiver device 5 are located between the circuit board 3 (which can also achieve a shielding effect) and the shielding case 6, so as to effectively shield ambient interference.

In the distance detecting sensor 100 of the present invention, the transmitter device 4 and the receiver device 5 are held by the positioning brackets 7, 8, to assure the positioning precisions of the transmitter device 4 and the receiver device 5. The positioning brackets 7, 8, in cooperation with the housing 1 for fixing, can assure relative positions of the transmitter device 4 and the receiver device 5 with respect to the housing 1. The transmitter device 4 and the receiver device 5 are installed to the respective containers of the positioning brackets 7, 8 followed by welding and fixing, which assures that the positioning precision thereof will not be influenced by the installation, thereby effectively avoiding the defects presented in case that the transmitter device 4 and the receiver device 5 are welded on the circuit board 3 wherein the installation precision would be insufficient due to some problem such as that related to the installation process and thus the distance detecting sensor 100 cannot achieve a desirable effect or even fails in function.

In addition, the distance detecting sensor 100 of the present invention has a low production cost which facilitates its popular applications.

Though the particular embodiments of the present invention have been disclosed as above, the scope of the present invention is not limited thereto. Any modification or variation to the above-described particular embodiments by those skilled in the art will be covered by the scope of the present invention.

The invention claimed is:
1. A distance detecting sensor, comprising:
a housing;

a focusing lens;
a circuit board;
a transmitter device for transmitting infrared rays;
a receiver device for sensing the reflected light rays; and
a shielding case for a shielding function wherein the housing comprises a main body and two circular apertures located on a top surface of the main body;
wherein the lens is installed in the main body of the housing and comprises transmitting lens and receiving lens installed at positions of the apertures of the housing;
wherein the circuit board is installed in the main body of the housing and provided with several electronic elements for signal processing;
wherein the transmitter device is installed on the circuit board and transmits the infrared light rays to the transmitting lens;
wherein the receiver device is a distance detecting sensing module, which is installed on the circuit board and receives and senses the reflected light rays focused by the receiving lens;
wherein the shielding case is installed around the transmitter device and the receiver device, for preventing electromagnetic interference;
wherein the transmitter device and the receiver device are installed on the same side of the circuit board;
wherein the circuit board is provided, in positions where the transmitter device and the receiver device are installed, with first and second via holes, such that the transmitted light rays from the transmitter device can travel through the first via hole to the transmitting lens and the reflected light rays received by the receiving lens can travel through the second via hole to the receiver device.

2. The distance detecting sensor according to claim 1, wherein the transmitter device is an infrared light emitting diode.

3. The distance detecting sensor according to claim 1, wherein the distance detecting sensor further comprises an indicator light for displaying an operation state or an abnormal condition, the indicator light being installed on the circuit board and located near the transmitter device.

4. The distance detecting sensor according to claim 1, wherein the shielding case is divided into first and second shielding cases welded with each other;
wherein the first shielding case is fixed to the housing by a screw and contacts the circuit board to achieve grounding, the second shielding case is fixed to the housing by a clamping mechanism, and the transmitting device and the receiver device are installed between the shielding case and the circuit board.

5. The distance detecting sensor according to claim 1, wherein the distance detecting sensor further comprises a seal installed between the transmitting lens and the transmitter device or between the receiving lens and the receiver device.

6. The distance detecting sensor according to claim 1, wherein the distance detecting sensor further comprises a wiring arranging device fixed on the housing by a screw.

7. The distance detecting sensor according to claim 1, wherein the lens and the housing are installed together by a manner of injection molding.

8. The distance detecting sensor according to claim 1, wherein the housing is made of an electrically conductive material.

9. A distance detecting sensor, comprising:
a housing;
a focusing lens; and
a circuit board provided with several electronic elements, as well as a transmitter device for transmitting infrared light rays and a receiver device for receiving and sensing the reflected infrared light rays
wherein the housing comprises an elongated main body and two apertures located on a top surface of the main body;
wherein the lens comprises a transmitting lens and a receiving lens located at positions of the two apertures of the housing;
wherein the circuit board is received in the main body of the housing and located below the lens, for signal processing;
wherein the transmitter device and the receiver device are installed on the circuit board and positioned directly below the transmitting lens and the receiving lens;
wherein the transmitter device is an infrared light emitting diode and the receiver device is a distance detecting sensing module;
wherein the transmitter device and the receiver device are installed on the side of the circuit board opposite to the lens;
wherein the circuit board is provided with a first via hole and a second via hole through which the transmitted light rays and the received light rays can pass respectively, the first via hole positioned between the transmitting lens and the transmitter device and the second via hole positioned between the receiving lens and the receiver device.

10. The distance detecting sensor according to claim 9, wherein a shielding body for preventing electromagnetic interference is disposed between the transmitter device and the transmitting lens.

11. The distance detecting sensor according to claim 9, wherein the distance detecting sensor further comprises a seal installed between the transmitting lens and the transmitter device or between the receiving lens and the receiver device.

12. The distance detecting sensor according to claim 9, wherein the lens and the housing are formed together by injection molding.

13. The distance detecting sensor according to claim 9, wherein the housing is made of an electrically conductive material.

* * * * *